United States Patent [19]
Chen et al.

[11] Patent Number: 5,525,830
[45] Date of Patent: *Jun. 11, 1996

[54] METAL-TO-METAL ANTIFUSE INCLUDING ETCH STOP LAYER

[75] Inventors: Wenn-Jei Chen, Sunnyvale; Steve S. Chiang, Saratoga; Frank W. Hawley, Campbell, all of Calif.

[73] Assignee: Actel Corporation, Sunnyvale, Calif.

[ * ] Notice: The term of this patent shall not extend beyond the expiration date of Pat. No. 5,525,830.

[21] Appl. No.: 322,871

[22] Filed: Oct. 12, 1994

Related U.S. Application Data

[63] Continuation of Ser. No. 172,132, Dec. 21, 1993, Pat. No. 5,381,035, which is a continuation-in-part of Ser. No. 950,264, Sep. 23, 1992, abandoned.

[51] Int. Cl.$^6$ .............................. H01L 27/02; H01L 23/48
[52] U.S. Cl. .......................... 257/530; 257/50; 257/754
[58] Field of Search .............................. 257/530, 50, 754, 257/757; 437/293, 295, 922

[56] References Cited

U.S. PATENT DOCUMENTS

| | | | |
|---|---|---|---|
| 4,561,409 | 3/1987 | Ellsworth et al. | 29/576 B |
| 4,748,490 | 5/1988 | Hollingsworth | 357/51 |
| 4,796,075 | 1/1989 | Whitten | 357/51 |
| 4,822,753 | 4/1989 | Pintchovski | 437/192 |
| 4,847,732 | 7/1989 | Stopper et al. | 361/395 |
| 4,870,302 | 9/1989 | Freeman | 307/465 |
| 4,899,205 | 2/1990 | Hamdy et al. | 357/51 |
| 4,914,055 | 4/1990 | Gordon et al. | 437/192 |
| 4,933,576 | 6/1990 | Tamamura et al. | 307/455 |
| 4,943,538 | 7/1990 | Mohsen et al. | 437/52 |
| 5,070,384 | 12/1991 | McCollum et al. | 357/51 |
| 5,087,591 | 2/1992 | Teng . | |
| 5,095,362 | 3/1992 | Roesner | 357/23.4 |
| 5,100,827 | 3/1992 | Lytle | 437/52 |
| 5,120,679 | 6/1992 | Boardman et al. | 437/195 |
| 5,121,184 | 6/1992 | Huang et al. . | |
| 5,134,457 | 7/1992 | Hamdy et al. | 357/51 |
| 5,166,556 | 11/1992 | Hsu et al. | 307/465 |
| 5,171,715 | 12/1992 | Husher et al. | 437/195 |
| 5,194,759 | 3/1993 | El-Ayat et al. | 307/202.1 |
| 5,196,724 | 3/1993 | Gordon et al. | 257/530 |
| 5,210,598 | 5/1993 | Nakazaki et al. | 257/530 |
| 5,233,217 | 8/1993 | Dixit et al. | 257/530 |
| 5,266,829 | 11/1993 | Hamdy et al. | 257/530 |
| 5,272,101 | 12/1993 | Forouhi et al. | 437/44 |
| 5,272,666 | 12/1993 | Tsang et al. | 365/96 |
| 5,290,734 | 3/1994 | Boardman et al. | 437/195 |
| 5,300,456 | 4/1994 | Tigelaar et al. | 437/195 |
| 5,308,795 | 5/1994 | Hawley et al. | 437/195 |
| 5,322,812 | 6/1994 | Dixit et al. | 437/60 |

FOREIGN PATENT DOCUMENTS

| | | |
|---|---|---|
| 0081226 | 6/1983 | European Pat. Off. . |
| 8700969 | 7/1986 | European Pat. Off. . |
| 8702827 | 10/1986 | European Pat. Off. . |
| 0414361 | 2/1991 | European Pat. Off. . |
| 0455414 | 4/1991 | European Pat. Off. . |
| 0436387 | 7/1991 | European Pat. Off. . |
| 9213359 | 1/1992 | European Pat. Off. . |
| 00501120 | 1/1992 | European Pat. Off. . |
| 9220109 | 4/1992 | European Pat. Off. . |
| 9303499 | 7/1992 | European Pat. Off. ...... H01L 23/525 |

*Primary Examiner*—J. Carroll
*Attorney, Agent, or Firm*—D'Alessandro & Ritchie

[57] ABSTRACT

According to the present invention, planar layers of Nitride (first nitride layer), a-Si (first a-Si layer), Nitride (second Nitride layer) and a-Si (second a-Si layer) are laid down over a first metallization layer. A dielectric layer is then laid down on top of the second a-Si layer. A via is opened in the dielectric layer with an etch gas which attacks a small portion of the second a-Si layer which, in effect, serves as a sacrificial etch-stop layer. A titanium layer is laid down over the via and allowed to thermally react with the remainder of the second a-Si layer to form an electrically conductive titanium silicide region in the area of the via the thickness of the second a-Si layer. The reaction is self-limiting and stops at the second Nitride layer. Subsequently a second metallization layer is disposed over the via. Thus the partially etched second a-Si layer forms a part of the second metallization layer and the Nitride/a-Si/Nitride insulating antifuse layer has a constant thickness determined by the process used to lay it down, rather than on the more uncontrollable etch process. Accordingly, the programming voltage of the antifuse is more predictable than with prior art antifuse structures.

10 Claims, 1 Drawing Sheet

METAL-TO-METAL ANTIFUSE INCLUDING ETCH STOP LAYER

CROSS-REFERENCE TO RELATED APPLICATION

This application is a continuation of co-pending U.S. patent application Ser. No. 08/172,132, filed Dec. 21, 1993, now U.S. Pat. No. 5,381,035, which is a continuation-in-part of U.S. patent application Ser. No. 07/950,264, entitled ANTIFUSE ELEMENT AND FABRICATION METHOD, and filed Sep. 23, 1992, now abandoned, in the name of inventor Frank W. Hawley. U.S. patent application Ser. No. 07/950,264 is also assigned to Actel Corporation and is hereby incorporated herein by reference as if set forth fully herein.

BACKGROUND OF THE INVENTION

1. Field of the Invention

This invention relates to an improved metal-to-metal antifuse and a method of making a metal-to-metal antifuse which yields an antifuse having a more predictable break down voltage than available in prior art antifuses.

2. The Prior Art

Field Programmable Gate Arrays (FPGAs) and other modern user programmable semiconductor devices comprise antifuses as programmable elements to effect user programmability of the functions and operation of such devices. Antifuses are generally devices which comprise a pair of conductive layers sandwiched about an insulating antifuse layer. Application of a voltage in excess of the "programming" or breakdown voltage of the antifuse across the conductive layers causes a conductive filament or "via link" to form in the antifuse layer between the two conductive layers, effectively shorting the two conductive layers together and "programming" the antifuse to an "on-state." An unprogrammed antifuse has no conductive filament connecting the two conductive layers, hence it is in the "off-state."

Antifuse conductive layers have been fabricated from a number of different conductive layer materials as well as a number of different insulating antifuse materials. Antifuse on-state resistances vary from a few ohms to a few hundred ohms, depending upon the materials and structure used, while the off-state resistances range to a few gigaohms. Programming voltages range from a few volts to about 20 volts.

The programming voltage of an antifuse is essentially a function of the thickness of the antifuse layer. The thinner the layer, the less the programming voltage, the thicker the layer, the higher the programming voltage. Any unpredictability in the thickness of the antifuse layer resulting from the processes used to fabricate the antifuse will translate into an uncertainty in the programming voltage for the fuse as well as an uncertainty in the operating voltages which may safely be used without inadvertently programming the antifuse.

Because antifuses are used to program the functions and operation of FPGAs and other applications of user programmable semiconductor devices, the failure of an antifuse, either due to inadvertent programming or inability to program at the predicted programming voltage can render an entire device inoperative and defective. Others have tried to improve the yield and predictability of antifuses, however, the devices of the prior art remain somewhat unreliable when built to be programmed and operate at the lower voltages present in today's semiconductors. This is in large part due to the fact that most metal-to-metal antifuses, which are favored in CMOS compatible processes, are made by opening a via in the dielectric layer and then applying the antifuse layer over and in the via. The result is a layer of varying thickness which may form cusps in the non-square via. For example, U.S. Pat. No. 5,120,679 to Boardman et al. teaches an antifuse structure having oxide spacer elements to cover cusps formed in the amorphous silicon ("a-Si") insulating antifuse layer which is applied to an opening in the dielectric layer. Boardman's device, necessarily, has a relatively unpredictable antifuse layer thickness and he attempts to get around this by shielding all but the central portion of the layer in the middle of the via.

More recently, strap type architectures have become available in the art which allow for a planar antifuse layer, avoiding the problems noted by Boardman et al. In the paper "Field Programmable Gate Array (FPGA) Process Design For Multilevel Metallization Technology" by K. S. Ravindhran et al. presented at the June, 1993 VMIC Conference, the structure disclosed is essentially that set forth in FIG. 1.

Turning to FIG. 1 an antifuse structure 10 similar to that taught by K. S. Ravindhran et al., supra, is shown. A first metallization layer 12 is disposed on an insulating portion of an integrated circuit, such as silicon dioxide. Metallization layer 12 may comprise, for example, TiW. A first amorphous silicon ("a-Si") layer 14 is disposed over TiW layer 12. A dielectric layer, such as a CVD oxide layer 16 is disposed over first a-Si layer 14. A via 18 is opened in oxide layer 16 with an etch gas. The etch process is stopped after the via extends all of the way through oxide layer 16 and partially into first a-Si layer 14 in the region denoted with reference numeral 20. A second metallization layer 22 is disposed over via 18. Second metallization layer 22 may comprise a first layer 24 of TiW and a second layer 26 of aluminum.

Unfortunately, the antifuse layer is reached by etching an opening in a CVD oxide dielectric layer. Because the antifuse layer can also be etched by the gases used to etch the dielectric layer, an unpredictable amount of antifuse is also etched away during the process resulting in a somewhat unpredictable thickness for the antifuse layer and a corresponding unpredictable programming voltage. As operating and programming voltages drop to accommodate lower powered devices, the problems presented by this unpredictability grow large. Accordingly, there is a need for an improved antifuse structure and method for making the same which provides a highly predictable and repeatable programming voltage.

OBJECTS AND ADVANTAGES OF THE INVENTION

Accordingly, it is an object of the present invention to provide an antifuse structure having a highly controllable programming voltage.

It is a further object of the present invention to provide an antifuse structure with a predictable programming voltage.

It is a further object of the present invention to provide a method of making an antifuse structure having a highly controllable programming voltage.

Yet a further object of the present invention to provide a method of making an antifuse structure with a predictable programming voltage.

3

These and many other objects and advantages of the present invention will become apparent to those of ordinary skill in the art from a consideration of the drawings and ensuing description of the invention.

SUMMARY OF THE INVENTION

According to the present invention, planar layers of Nitride (first nitride layer), a-Si (first a-Si layer), Nitride (second Nitride layer) and a-Si (second a-Si layer) are laid down over a first metallization layer. A dielectric layer is then laid down on top of the second a-Si layer. A via is opened in the dielectric layer with an etch gas which attacks a small portion of the second a-Si layer which, in effect, serves as a sacrificial etch-stop layer. A titanium layer is laid down over the via and allowed to thermally react with the remainder of the second a-Si layer to form an electrically conductive titanium silicide region in the area of the via the thickness of the second a-Si layer. The reaction is self-limiting and stops at the second Nitride layer. Subsequently a second metallization layer is disposed over the via. Thus the partially etched second a-Si layer forms a part of the second metallization layer and the Nitride/a-Si/Nitride insulating antifuse layer has a constant thickness determined by the process used to lay it down, rather than on the more uncontrollable etch process. Accordingly, the programming voltage of the antifuse is more predictable than with prior art antifuse structures.

DESCRIPTION OF THE PREFERRED EMBODIMENTS

Those of ordinary skill in the art will realize that the following description of the present invention is illustrative only and is not intended to be in any way limiting. Other embodiments of the invention will readily suggest themselves to such skilled persons from an examination of the within disclosure.

Figure 1:
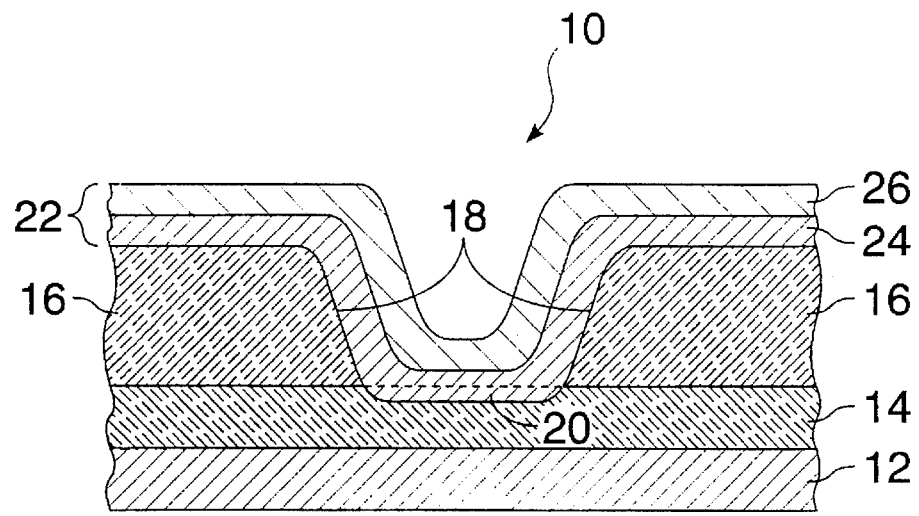
FIG. 1 is a diagram of a prior art antifuse structure.
Figure 2:
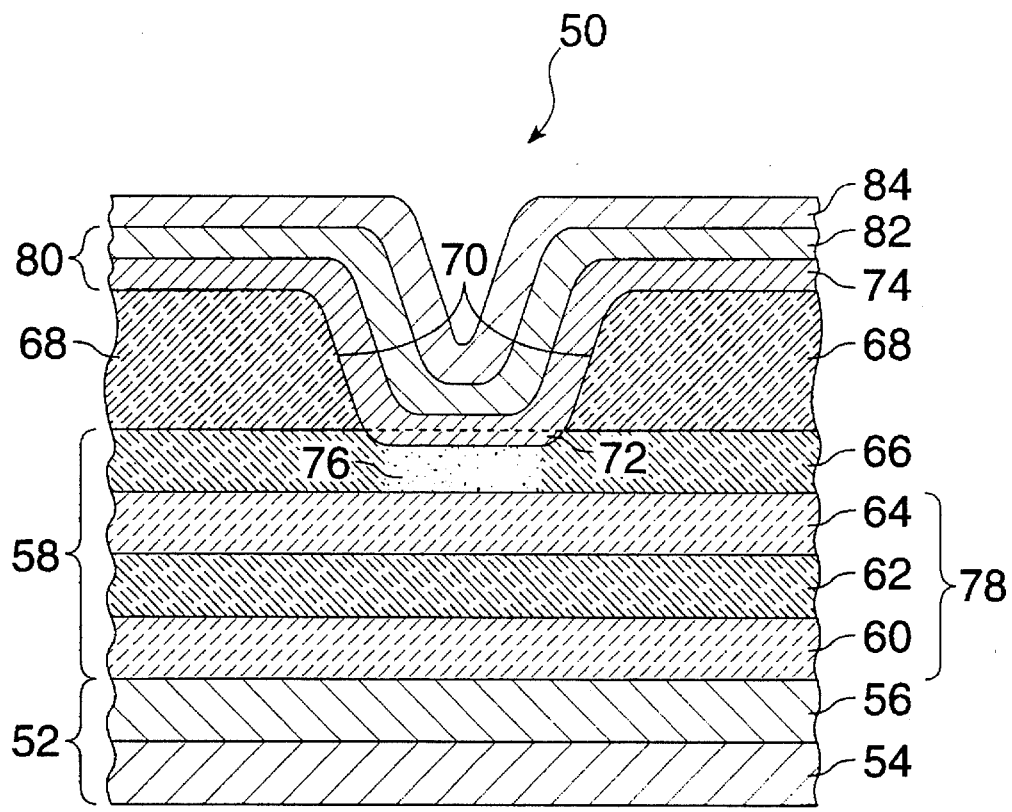
FIG. 2 is a diagram of an antifuse structure according to a preferred embodiment of the present invention.

An antifuse structure 50 according to the present invention is depicted in FIG. 2. A first metallization layer 52 is preferably disposed on an insulating portion of a semiconductor, such as a silicon dioxide layer over the substrate. Preferably first metallization layer 52 comprises a first metal layer 54 and a first TiN layer 56. According to a preferred embodiment of the present invention metal layer 54 is aluminum of thickness 5000 Å and may preferably range in thickness from 3000 Å to 7000 Å. TiN layer 56 is preferably 2000 Å and may preferably range in thickness from 500 Å to 3000 Å. Other materials could be used instead of TiN such as Ti, W, TiW, TiWN and any combination of TiN and any of the aforementioned materials.

Disposed over first metallization layer 52 is a N-A-N-A sandwich 58 which comprises a first nitride layer 60, a first a-Si layer 62, a second nitride layer 64, and a second a-Si layer 66. First nitride layer 60 is preferably of thickness 100 Å and may preferably range in thickness from 30 Å to 300 Å. First a-Si layer 62 is preferably of thickness 400 Å and may preferably range in thickness from 100 Å to 1000 Å. Second nitride layer 64 is preferably of thickness 100 Å and may preferably range in thickness from 30 Å to 300 Å.

Second a-Si layer 64 is preferably of thickness 350 Å and may preferably range in thickness from 50 Å to 1000 Å.

On top of N-A-N-A layer 58 is disposed a dielectric layer 68. Dielectric layer 68 is preferably CVD oxide of thickness 6000 Å and may preferably range in thickness from 3000 Å to 10000 Å. Other dielectric materials may also be used such as CVD nitrides and combinations of CVD oxides and nitrides without departing from the scope of the invention.

Each of the aforementioned layers is preferably disposed in planar fashion over the integrated circuit in a controlled fashion so as to yield predictable and known layer thicknesses.

A via 70 is opened in dielectric layer 68 by etching with an etch gas according to methods well known to those of ordinary skill in the art and accordingly not set forth here. Since such etching is difficult to control precisely, in order to completely open via 70 through the entirety of dielectric layer 68, some portion of second a-Si layer 66 will also inevitably be etched. This etched portion is shown by reference numeral 72. The portion of second a-Si layer 66 immediately adjacent via 70 may now be less thick than before the etching process was carried out.

A layer 74 of Ti is next disposed over via 70. Ti layer 74 is preferably 500 Å thick and may preferably range in thickness from 100 Å to 3000 Å. Ti layer 74 is now allowed to thermally react with second a-Si layer 66 as follows:

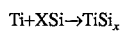

The thermal reaction of Ti layer 74 and second a-Si layer 66 is self-limiting and ends when the entire thickness of second a-Si layer 66 has been turned to titanium silicide. The result of the thermal reaction between Ti layer 74 and second a-Si layer 66 is the formation of a region 76 of titanium silicide which is electrically conductive and extends downward to stop at the top of second nitride layer 64. Accordingly, insulating antifuse layer 78 of antifuse 50 comprises N-A-N (Nitride/a-Si/Nitride) layers 60, 62 and 64 with second a-Si layer 66 (now including Ti-silicide region 76) in effect forming a part of second metallization layer 80. Second metallization layer 80 is disposed over via 70 in a conventional manner and preferably comprises a second TiN layer 82 and a second metal layer 84. According to a preferred embodiment of the present invention second TiN layer 82 is of thickness 1000 Å and may preferably range in thickness from 300 Å to 3000 Å. Other materials could be used instead of TiN such as TiW, W, TiWN and any combinations of TiN and the aforementioned materials. Second metal layer 84 is preferably aluminum of thickness 7000 Å and may preferably range in thickness from 4000 Å to 10000 Å.

According to another preferred embodiment of the present invention, insulating antifuse layer 78 may instead comprise a first layer of amorphous silicon disposed on metallization layer 52 and a second layer of an insulating material (other than amorphous silicon) disposed on the first layer. Preferably the second layer of insulating material is silicon nitride.

The above structure is particularly useful for three or more metallization layer semiconductor fabrication techniques.

The methods used to dispose the various layers set forth above are all well known to those of ordinary skill in the art and are accordingly not set forth herein in great detail in order to avoid over complicating the disclosure.

While illustrative embodiments and applications of this invention have been shown and described, it would be apparent to those skilled in the art that many more modifications than have been mentioned above are possible without departing from the inventive concepts set forth herein. The invention, therefore, is not to be limited except in the spirit of the appended claims.

What is claimed is:

1. An antifuse disposed within an integrated circuit device, said antifuse comprising:

a first metallization layer disposed within the integrated circuit device;

an insulating antifuse layer disposed over said first metallization layer;

a layer of amorphous silicon disposed over said insulating antifuse layer;

a dielectric layer disposed over said layer of amorphous silicon;

a via completely penetrating said dielectric layer;

said via partially penetrating said amorphous silicon layer;

a layer of titanium metal disposed within said via and reacted with said layer of amorphous silicon to form a region of titanium silicide extending vertically substantially all of the way through said layer of amorphous silicon; and a second metallization layer in electrical contact with said region of titanium silicide.

2. An antifuse according to claim 1 wherein said insulating antifuse layer comprises a second layer of amorphous silicon disposed vertically between first and second layers of silicon nitride.

3. An antifuse according to claim 2 wherein said first metallization layer comprises a first layer of aluminum and disposed vertically thereon a first layer of TiN.

4. An antifuse according to claim 3 wherein said second metallization layer comprises a second layer of TiN and disposed vertically thereon a second layer of aluminum.

5. An antifuse disposed within an integrated circuit, said antifuse comprising:

a first metallization layer disposed within the integrated circuit;

an insulating antifuse layer disposed over said first metallization layer, said insulating antifuse layer including a first layer of amorphous silicon disposed over said first metallization layer and a second layer of an insulating material disposed over said first layer of amorphous silicon, said insulating material being a material other than amorphous silicon;

a second layer of amorphous silicon disposed over said insulating antifuse layer;

a dielectric layer disposed over said second layer of amorphous silicon;

a via completely penetrating said dielectric layer;

said via partially penetrating said second layer of amorphous silicon;

a layer of titanium metal disposed over and within said via and reacted with said second layer of amorphous silicon to form a region of titanium silicide extending vertically substantially all of the way through said layer of amorphous silicon; and a second metallization layer in electrical contact with said region of titanium silicide.

6. An antifuse according to claim 5 wherein said second layer of an insulating material includes silicon nitride.

7. An antifuse according to claim 5 wherein said first metallization layer includes a first layer of aluminum and disposed vertically thereon a first layer of TiN.

8. An antifuse according to claim 7 wherein said second metallization layer includes a second layer of TiN and disposed vertically thereon a second layer of aluminum.

9. An antifuse according to claim 6 wherein said first metallization layer includes a first layer of aluminum and disposed vertically thereon a first layer of TiN.

10. An antifuse according to claim 9 wherein said second metallization layer includes a second layer of TiN and disposed vertically thereon a second layer of aluminum.

* * * * *

UNITED STATES PATENT AND TRADEMARK OFFICE
CERTIFICATE OF CORRECTION

PATENT NO. : 5,525,830
DATED : June 11, 1996
INVENTOR(S) : Wenn-Jei Chen; Steve S. Chiang; Frank W. Hawley It is certified that error appears in the above-indentified patent and that said Letters Patent is hereby corrected as shown below:

On title page, "[*] Notice", replace
"5,525,830" with --5,381,035--.

Signed and Sealed this

Fifth Day of November, 1996

Attest:

BRUCE LEHMAN

*Attesting Officer*  *Commissioner of Patents and Trademarks*